US006677865B1

United States Patent
Xu

(10) Patent No.: US 6,677,865 B1
(45) Date of Patent: Jan. 13, 2004

(54) METHOD AND CONFIGURATION FOR DECODING INFORMATION

(75) Inventor: Wen Xu, Unterhaching (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/149,232

(22) PCT Filed: Nov. 14, 2000

(86) PCT No.: PCT/DE00/03998

§ 371 (c)(1),
(2), (4) Date: Sep. 25, 2002

(87) PCT Pub. No.: WO01/43294

PCT Pub. Date: Jun. 14, 2001

(30) Foreign Application Priority Data

Dec. 8, 1999 (DE) .......................................... 199 59 178

(51) Int. Cl.⁷ .............................................. H03M 7/00

(52) U.S. Cl. ........................................... 341/50; 341/51
(58) Field of Search ............................... 341/50, 51, 67

(56) References Cited

U.S. PATENT DOCUMENTS

| 4,670,890 A | * | 6/1987 | Titchener ..................... 375/110 |
| 5,218,622 A | * | 6/1993 | Fazel et al. .................. 375/122 |
| 6,292,922 B1 | * | 9/2001 | Ruscitto et al. ............. 714/795 |

* cited by examiner

Primary Examiner—Jean Bruner Jeanglaude
Assistant Examiner—Joseph Lauture
(74) Attorney, Agent, or Firm—Bell Boyd & Lloyd LLC

(57) ABSTRACT

A method and system for decoding information that is output by an information source and transmitted in coded fashion via a transmission channel affected by interference, wherein the influence of statistical information, which is applied along side the transmitted information via the information source, on the decoding is modified as a function of the reliable of the decoding.

12 Claims, 2 Drawing Sheets

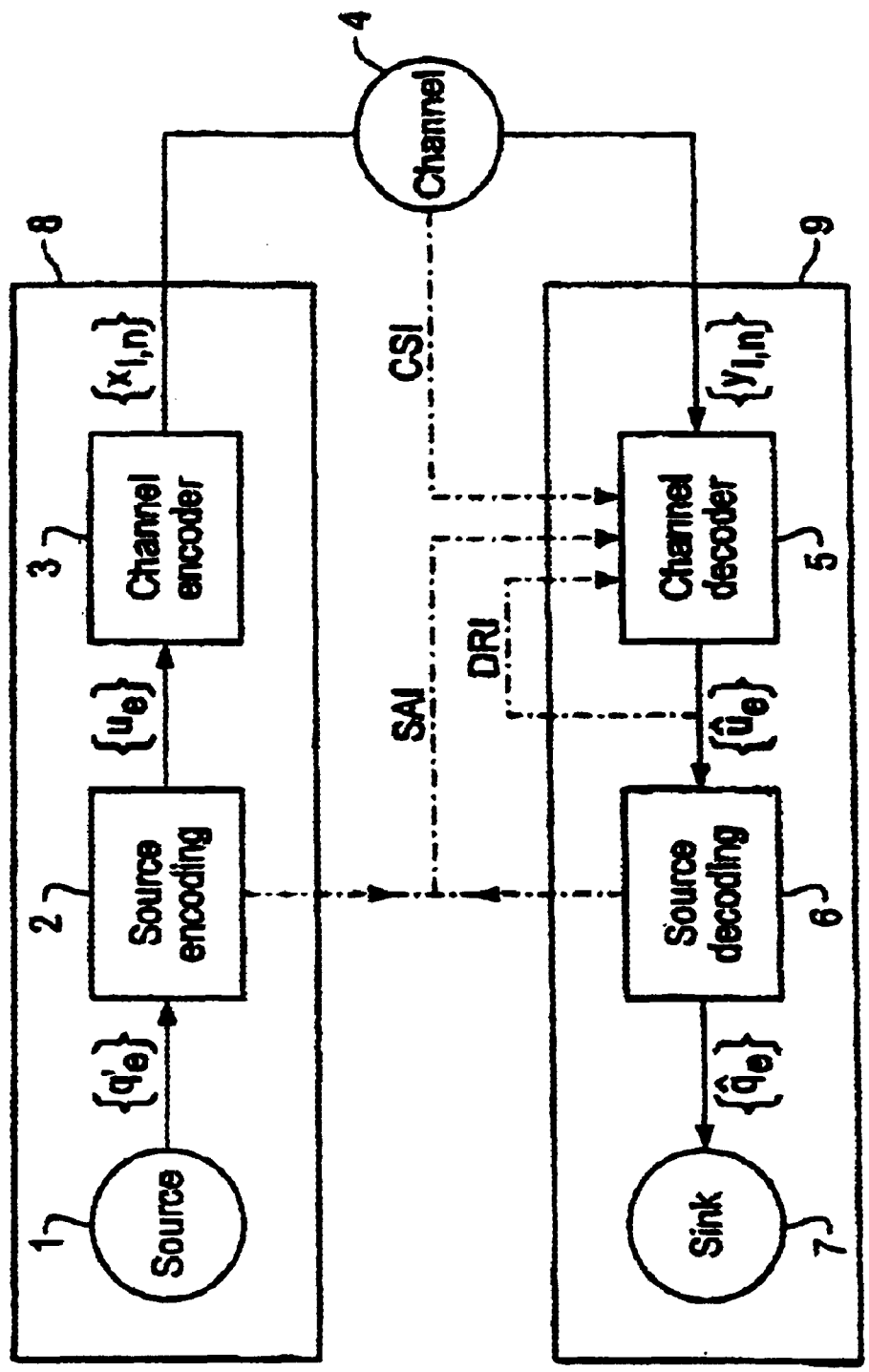

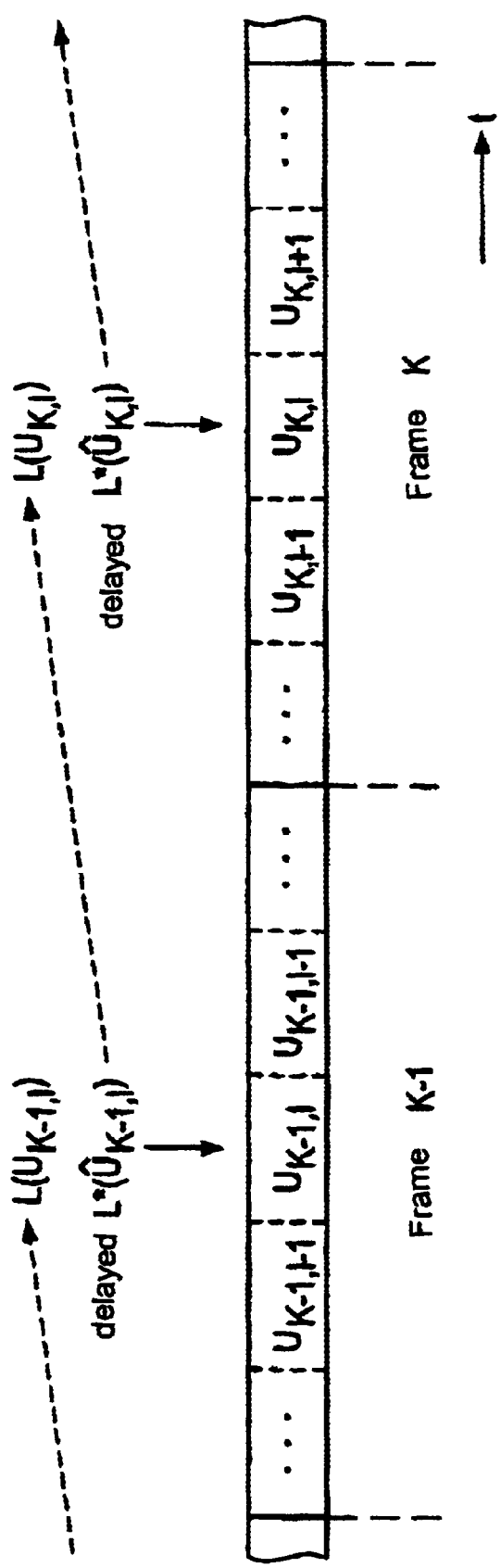

METHOD AND CONFIGURATION FOR DECODING INFORMATION

BACKGROUND OF THE INVENTION

The present invention relates to a method and a system for decoding information that is output by an information source, coded and transmitted via a transmission channel affected by interference.

Source signals such as speech or video signals generally contain statistical redundancy. This redundancy can be reduced by source coding so as to permit efficient transmission and storage of the source signal. It is known to add redundancy specifically at the transmitting end by channel coding in order to cancel channel interference at the receiving end.

Because of incomplete knowledge of the source signals or restrictions associated with the complexity of the coding method, it is usually possible to implement source coding only suboptimally; that is to say, there is still a certain redundancy present in the compressed data. This residual redundancy can be utilized as a priori/a posteriori information in the case of so-called source-controlled or joint source and channel decoding in order to correct further bit errors. In this case, the decoding operation of the channel decoder is controlled both by the transmitted information and by a priori/a posteriori information on the likely value of a few important source bits. A method based on a Kalman filter can be used, for example, to estimate the a priori/a posteriori information.

However, it has emerged that the use of this residual redundancy, or the a priori/a posteriori information, can lead to decoding errors during channel decoding in the course of source-controlled channel decoding. Thus, the application of the a priori/a posteriori information leads to impairment of the decoding when the value of a bit position that is to be transmitted deviates from the statistical a priori/a posteriori information on the value of this bit position.

It is, therefore, on object of the present invention to render decoding of information possible by applying statistical information via the information source with satisfactory decoding results.

SUMMARY OF THE INVENTION

Thus, the present invention is based on the principle, for source-controlled channel decoding, of modifying the influence of the a priori or a posteriori information on the source statistics as a function of the reliability of the decoding.

In order to decide on a value assigned to a bit position, alongside the transmitted information, statistical information is applied via the information source, the influence of the statistical information via the information source on the decision being modified as a function of the reliability of the decoding.

For example, a value can be determined that characterizes the reliability of the decoding and with which the statistical information via the information source is weighted; in particular, multiplied.

It is thereby possible, depending on the current reliability of the decoding, to accord the statistical information via the information source a greater or lesser influence on the decision on the value to be assigned to a bit position.

One embodiment of the present invention provides that the decoding, particularly the channel decoding, has a soft output that constitutes a measure of the reliability of the decoding. The value of a soft output can directly or indirectly modify the influence of the statistical information via the information source on the decoding. Soft-output decoding methods, such as soft-output Viterbi algorithms or soft-output maximum likelihood decoding methods, are known as such to a person skilled in the art.

A number of consecutive decoding steps also can be carried out for decoding purposes. Another embodiment of the present invention provides that a first decoding step is carried out without applying statistical information via the information source, a second decoding step is carried out by applying statistical information via the information source, and the influence of the statistical information via the information source on the decoding is modified as a function of the reliability of the decoding in the first decoding step.

It is possible, in this case, for the first decoding step to relate to the same bit position as the second decoding step, or the first decoding step to relate to a first bit position and the second decoding step to relate to a second bit position; for example, a subsequent frame. Particularly owing to introduction into an iterative decoding method such as turbo decoding, for example, this leads, as shown by complex simulations, to good decoding results without substantially increasing the computational outlay for the decoding.

Finally, another embodiment of the present invention provides that the influence of the statistical information via the information source on the decoding is relatively strong in conjunction with relatively low reliability of the decoding, whereas it is relatively small in conjunction with relatively high reliability of the decoding.

Additional features and advantages of the present invention are described in, and will be apparent from, the following detailed description of the invention and Figures.

BRIEF DESCRIPTION OF THE FIGURES

FIG. 1 shows a block diagram of a data transmission chain.

FIG. 2 shows two data frames to be transmitted.

DETAILED DESCRIPTION OF THE INVENTION

FIG. 1 shows a block diagram of essential functional units for data transmission. The transmission of a frame k is also described in this case, for the purpose of greater clarity there being no reference in the figures and following explanations to the index k, which assumes the natural numbers, if this is not necessary for understanding the exemplary embodiments. Transmission in frames is not a necessary precondition for the present invention. The design of the frame k is explained below with the aid of FIG. 2.

A source symbol sequence $\{q_{1'}\}$ generated in a transmitter 8 by an information source 1 includes source symbols $q_{1'}$ that have, for example, the values "+1" and "−1" as a function of the information to be sent. The index 1' runs for the source symbols $q_{1'}$ transmitted in the frame k from 0 to L'−1, L' being the number of source symbols $q_{1'}$ per frame k. The source symbol sequence $\{q_{1'}\}$ is compressed by a source coder 2, for example with the aid of a GSM full rate voice coder. In this case, a source-coded sequence $\{u_1\}$ of source-coded symbols $u_1$ is generated. The source-coded symbols $u_1$ have the value of either "+1" or "−1". The index 1 runs within a frame from 0 to L−1, L being the number of source-coded symbols $u_1$ in a frame. In this case, L' is usually bigger than L.

The source-coded sequence $\{u_1\}$ is then coded against channel interference in a channel coder 3, use being made of a convolutional code, for example. A channel-coded sequence {$x_{1,n}$} of code words $x_1$, results in this case. Within the code word $x_1$, the bit positions are denoted via the index n, which runs within a code word $x_1$ from zero to N−1, N being the number of bit positions in a code word $x_1$. The bit positions $X_{l,n}$ of the code word $x_1$ have, in turn, the numerical value of either "+1" or "−1". The channel-coded sequence {$x_{1,n}$} is further processed in a modulator (not illustrated) and subsequently transmitted via a transmission link 4. The transmission link is a radio channel or a transmission line or else a storage medium from which data are read. During transmission via a radio channel, interference occurs, for example fading, being described by a fading factor $a_k$, and noise, being described by the noise factor $N_0$.

The transmission link 4 is situated between the transmitter 8 and a receiver 9. If appropriate, the receiver 9 includes an antenna (not illustrated) for receiving the signals transmitted via the transmission link 4, a sampling device, a demodulator for demodulating the signals, and an equalizer for eliminating the intersymbol interference. These devices likewise are not illustrated in FIG. 1 for the purpose of simplification. The equalizer outputs received values $y_{1,n}$ of a received sequence {$y_{1,n}$} Because of interference during transmission via the transmission link 4, the received values $y_{1,n}$ have values that can deviate from "+1" and "−1"; for example, "+0.2" or "−3.7".

The received values $y_{1,n}$ are further processed in a channel decoder 5. It is also possible to use a maximum a posteriori probability algorithm or maximum likelihood algorithm to evaluate the received values $y_{1,n}$. In this case, a data sequence transmitted via a transmission link is compared with a reference sequences s, and that reference sequence s is determined which is most likely to belong to the transmitted data sequence. Maximum a posteriori probability refers to that reference sequence s being selected for which the probability P (s|y) reaches a maximum, y being the received data sequence. The maximum likelihood refers to that reference sequence s being selected for which the probability P (y|s) reaches a maximum. A maximum likelihood decoding can be implemented, for example, via a Viterbi algorithm known per se. The convolutional coding carried out by the channel coder 3 thus can be cancelled again in the channel decoder 5, the aim being to correct transmission errors.

The channel decoder 5, which can be formed by a processor device, such as a digital signal processor, for example, generates a received source-coded sequence {$û_1$} of source-coded or channel-decoded received symbols $û_1$. Belonging to each source-coded received symbol $û_{k-1,1}$ is an observed reliability value $L^*(û_{k-1,1})$ that is a so-called soft output from the channel decoder 5. This reliability value $L^*(û_{k-1,1})$ is a measure of the reliability with which the source-coded received symbol $û_1$ could be determined by the channel decoder 5.

In general, a logarithmic probability ratio L or L* can be defined as follows for a binary random variable with the elements {+1; −1}:

$$L(u_1) = \log\frac{P(u_1 = +1)}{P(u_1 = -1)} = \log\frac{1-p}{p}. \quad (0)$$

$P(u_1=-1)=p$ is the probability that $u_1$ has the value "−1". $P(u_1=+1)=1-p$ is, in contrast, the probability that $u_1$ has the value "+1". The abbreviation "log" indicates the natural logarithm. This value is also denoted as soft value or soft-output value. This can be an estimated value L that is determined a priori or a posteriori, and describes statistical information via the information source, or an observed value L* that describes the reliability of the decoding step carried out.

In accordance with the definition (0), the statistical information via the information source L or the observed reliability value L* is denoted by a real number in the range of {−∞, +∞}. If $u_1$ is classified with the aid of the values $L(u_1)$ as "+1" or "−1", then the sign ($L(u_1)$) specifies the so-called hard decision, and the value |$L(u_1)$| specifies the estimated a priori or a posteriori information or the reliability of the decision.

The source-coded received symbols $û_{k-1,1}$ and/or the observed reliability values $L^*(û_{k-1,1})$ are input into a source decoder 6 that decompresses the source-coded received symbols $û_1$, a source symbol sequence {$q̂_{1'}$} resulting from received source symbols $q̂_{1'}$.

The known Viterbi algorithm, for example, is used in the convolutional decoding. In order to carry out the Viterbi algorithm, the channel decoder 5 is also fed an item of channel state information CSI $Lc_{1,n}$, if appropriate. While the Viterbi algorithm is being carried out in the channel decoder 5, a so-called metric $M_1^{(m)}$ of the path m for the bit position 1 can be calculated using the following formula given the inclusion of statistical information via the information source SA1:

$$M_l^{(m)} = M_{l-1}^{(m)} + \sum_{n=0}^{N-1} \hat{x}_{l,n}^{(m)} LC_{l,n} y_{l,n} + \hat{u}_l^{(m)} L(u_{k,l}), \quad (1)$$

$M_{1-1}^{(m)}$ being the old metric of the path m, that is to say for the bit position 1-1, $\hat{x}_{1,n}^{(m)}$ being the bits of the code word belonging to the path m and to the bit position 1, $û_1^{(m)}$ being the decoded symbol belonging to the code word $\hat{x}_1^{(m)}$, and $L(u_{k,1})$ being statistical information via the information source that is a measure for that probability that the source-coded symbol $u_1$ is equal to "−1".

The statistical information via the information source SAI, that can be formed, in particular, by $L(u_{k,1})$, can be determined at the transmitting end in an "a priori" fashion before the decoding, depending on the variant embodiment, and transmitted to the receiver and stored, or determined in an "a posteriori" fashion after or during the decoding at the receiving end, for example by means of a Kalman filter. Such a method is known, for example, on the PCT publication with Laid-Open Number WO98/59423, in particular from the description relating to FIGS. 3 and 4.

The item of channel state information CSI =$Lc_{1,n}$ can be determined implicitly by determining a so-called channel soft output that corresponds to the product of the channel state information CSI =$Lc_{1,n}$ and the respective received value $y_{1,n}$. The following relationship holds for the channel soft output:

$$L_c y = L(x/y) - L(x) \quad (2),$$

which L(x/y) specifies the probability with which the value x occurs at the respective bit position of the code word when the received value y has been received, and L(x) specifies how reliably the value x can be determined. $L_c = 4aE_s/N_0$ holds for a so-called Gaussian/fading channel, a being the fading factor and $E_S/N_0$ the signal-to-noise ratio.

FIG. 2 shows two frames, specifically the current frame k and the preceding frame k−1, composed of source-coded symbols $u_1$. L source-coded received symbols $u_1$ belong to each frame k, k–1, such that the index 1 runs from 0 to L–1. A pronounced correlation frequently exists between specific source-coded symbols, for example the symbol $u_{k,1}$ and $u_{k-1,1}$ of consecutive frames k–1, k. This correlation can be used in order to determine "a posteriori" statistical information via the information source $L(u_{k,1})$.

If the metric increments $M_1^{(m)}$ for the states belonging to the received symbol $\hat{u}_{k-1,1}$ are calculated, the statistical information via the information source $L(u_{k-1,1})$ is therefore taken into account in each case in accordance with formula (1). The reliability value $L^*(\hat{u}_{k-1,1})$ is not yet known at this instant. If, thereafter, the metrics $M_1^{(m)}$ are determined for the states belonging to the received symbol $\hat{u}_{k,1}$, "a posteriori" statistical information via the information source $L(u_{k,1})$ can be calculated from the reliability value $L^*(\hat{u}_{k-1,1})$ known at this instant; for example, via a Kalman filter.

Assuming a case in which the same bit position within a frame virtually always has the value +1 in consecutive frames, and if the a priori information for $u_{k,1}$ is determined in the frame k from the already decoded bits at the same bit position in preceding frames, the estimated a priori information item $L(u_{k,1})>0$; that is to say, $u_{k,1}$ is +1 or –1 with a relatively high probability. However, if the value of this bit position is now –1, applying this a priori information for decoding $u_{k,1}$ has a negative influence on the decoding result.

Consequently, in accordance with one variant embodiment of the present invention, this a priori information is modified by a value that characterizes the reliability of the decoding. Thus, for example, the a priori information $L(u_{k,1})$ can be replaced in equation 1 by $(1-|m'(\hat{u}_k)|)L(u_{k,1})$, in which case $$m'(\hat{u}_{k,l}) = \tanh\frac{\lambda L*(\hat{u}_{k,l})}{2}$$

In this case, m' is a soft-output value that is a function of the scaled observed reliability value $\lambda L^*(\hat{u}_{k,1})(\lambda>0$ is a scaling value) of the bit position $\hat{u}_{k,1}$ in a preceding decoding step. $L^*(\hat{u}_{k,1})$ can, for example, be determined via a soft-output Viterbi algorithm or by a MAP (maximum a posteriori probability) decoder. In this case $$1 - |m'(\hat{u}_{k,l})| = \frac{2}{1 + e^{\lambda|L*(\hat{u}_{k,l})|}}$$

determines the uncertainty of the preceding decoding step. The a priori information, therefore, has a strong influence when the preceding decoding step is relatively unreliable ($|m'(\hat{u}_{k,1})|<<1$).

In this case, m' is a function of the reliability of the decoding which can be determined in a decoding step preceding the current decoding step. Depending on the variant embodiment, the preceding decoding step can relate to the same bit position of the same frame, a preceding bit position of the same frame, a preceding bit position of a preceding frame, or the same bit position of a preceding frame (illustrated in FIG. 2).

One embodiment of the present invention provides that the second decoding step is not carried out when the reliability of the decoding in the first decoding step is above a prescribed threshold value; for example, when |L*| is greater than a prescribed threshold value. This permits a reduction in the decoder outlay.

Because of the topicality of the reliability information, the decoding yields good decoder results; in particular, when- ever (otherwise than illustrated in FIG. 2) the same bit position of the same frame is decoded in the second decoding step as in the first decoding step, but in conjunction with the above explained utilization of the reliability of decoding determined in the first decoding step. Consequently, in this case two, or in the case of variant embodiments, more than two decoding steps are carried out for one bit position.

In particular, a soft-output value can be used to determine the reliability of the decoding. However, the present invention is in no way limited thereto; rather, the reliability of the decoding also can be described by other variables, known as such to a person skilled in the art, such as, for example, the voice frame error detection rate that is determined in the source decoder. In the first decoding step, no a priori information is used in this case for decoding. In the second decoding step, a priori information is used for decoding, but modified as a function of the reliability of the first decoding step.

One variant embodiment of the present invention provides for a priori information to be used for decoding even as early as in the first decoding step.

In the above explained examples, the present invention is described chiefly in conjunction with the channel decoding. However, the present invention is in no way limited thereto. Rather, it is within the scope of a person skilled in the art also to use the present invention in conjunction with other types of decoding. Thus, for example, it is likewise possible to use the present invention to improve an equalizer that can be regarded, for example, as a channel decoder of a rate-1 code in the case of the use of a Viterbi algorithm. The present invention likewise can be applied to demodulate signals; in particular, code-modulated ones.

Indeed, although the present invention has been described with reference to specific embodiments, those of skill in the art will recognize that changes may be made thereto without departing from the spirit and scope of the present invention as set forth in the hereafter appended claims.

What is claimed is:

1. A method for decoding information that is output by an information source and transmitted in coded fashion via a transmission channel affected by interference, the method comprising the steps of:
    applying statistical information along side the transmitted information about the information source; and
    modifying an influence of the statistical information about the information source on the decoding as a function of a reliability of the decoding.

2. A method for decoding information as claimed in claim 1, the method further comprising a soft-output decoding step, wherein a value of the soft-output decoding step characterizes the reliability of the decoding.

3. A method for decoding information as claimed in claim 1, wherein the influence of the statistical information about the information source on the decoding is modified as a function of the reliability of the decoding in a first decoding step, and decoding is carried out with the aid of the statistical information about the information source in a second decoding step.

4. A method for decoding information as claimed in claim 3, wherein the decoding is carried out in the first decoding step without statistical information about the information source.

5. A method for decoding information as claimed in claim 3, wherein the second decoding step is not carried out when the reliability of the decoding in the first decoding step is above a prescribed threshold value.

6. A method for decoding information as claimed in claim 1, wherein the influence of the statistical information about the information source on the decoding increases with decreasing reliability of the decoding.

7. A system for decoding information as claimed in claim 6, wherein the decoding includes a soft-output decoding step, with a value of the soft-output decoding step characterizing the reliability of the decoding.

8. A system for decoding information that is output by an information source and is transmitted in coded fashion via a transmission channel affected by interference, comprising a decoder that is set up such that, alongside the transmitted information, statistical information about the information source is applied for decoding purposes, and an influence of the statistical information about the information source on the decoding is modified as a function of a reliability of the decoding.

9. A system for decoding information as claimed in claim 8, wherein the influence of the statistical information about the information source on the decoding is modified as a function of the reliability of the decoding in a first decoding step, and decoding is carried out with the aid of the statistical information about the information source in a second decoding step.

10. A system for decoding information as claimed in claim 9, wherein the decoding is carried out in the first decoding step without statistical information about the information source.

11. A system for decoding information as claimed in claim 9, wherein the second decoding step is not carried out when the reliability of the decoding in the first decoding step is above a prescribed threshold value.

12. A system for decoding information as claimed in claim 8, wherein the influence of the statistical information about the information source on the decoding increases with decreasing reliability of the decoding.

* * * * *